US012700867B2

(12) United States Patent
Zhu et al.

(10) Patent No.: US 12,700,867 B2
(45) Date of Patent: Aug. 4, 2026

(54) DELAY ELEMENT GAIN CALIBRATION

(71) Applicant: QUALCOMM Incorporated, San Diego, CA (US)

(72) Inventors: Yunliang Zhu, San Diego, CA (US); Yiwu Tang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 113 days.

(21) Appl. No.: 18/497,464

(22) Filed: Oct. 30, 2023

(65) Prior Publication Data

US 2025/0141455 A1    May 1, 2025

(51) Int. Cl.
| | |
|---|---|
| *H03L 7/081* | (2006.01) |
| *H03K 5/00* | (2006.01) |
| *H03K 5/131* | (2014.01) |
| *H03L 7/085* | (2006.01) |

(52) U.S. Cl.
CPC ............ *H03L 7/081* (2013.01); *H03K 5/131* (2013.01); *H03L 7/085* (2013.01); *H03K 2005/00058* (2013.01)

(58) Field of Classification Search
CPC ........ H03L 2207/50; H03L 7/085; H03L 7/08
See application file for complete search history.

(56) References Cited

U.S. PATENT DOCUMENTS

| | | | |
|---|---|---|---|
| 8,976,053 B1 | 3/2015 | Zhang et al. | |
| 11,067,630 B2 * | 7/2021 | Conklin ............. | G01R 31/3191 |
| 2018/0254774 A1 | 9/2018 | Thijssen et al. | |

OTHER PUBLICATIONS

International Search Report and Written Opinion—PCT/US2024/052609—ISA/EPO—Feb. 7, 2025.
Levantino S., et al., "An All-digital Architecture for Low-jitter Regulated Delay Lines", 2009 16th IEEE International Conference on Electronics, Circuits and Systems—(ICECS 2009), Piscataway, NJ, USA, Dec. 13, 2009, pp. 603-606, XP031626256, section II entitled "DLL Architecture", p. 603-p. 605, figures 1-4.
Yang S., et al., "A 0.0056-mm2-249-dB-FoM All-Digital MDLL Using a Block-Sharing Offset-Free Frequency-Tracking Loop and Dual Multiplexed-Ring VCOs", IEEE Journal of Solid-State Circuits, IEEE, USA, vol. 54, No. 1, Jan. 1, 2019, pp. 88-98, XP011705342, section II entitled "Proposed Low-Power Offset-Free FTL", subsection A entitled "DCDL-Based Time Storage and Comparison Scheme", p. 89-p. 91, figures 2-4.
Nagam S., et al., "A Low-Jitter Ring-Oscillator Phase-Locked Loop Using Feedforward Noise Cancellation With a Sub-Sampling Phase Detector", IEEE Journal of Solid-State Circuits, vol. 53, No. 3, Mar. 2018, pp. 703-714.
Renukaswamy P.T., et al., "Fractional-N Sub-Sampling PLL Using a Calibrated Delay Line for Phase Noise Cancellation", 2021 IEEE International Symposium on Circuits and Systems, May 2021, 5 Pages.

* cited by examiner

*Primary Examiner* — Diana J. Cheng
(74) *Attorney, Agent, or Firm* — Gerald P. Joyce, III

(57) ABSTRACT

Certain aspects of the present disclosure are directed towards a method for delay element calibration. The method generally includes: incrementing a calibration delay control signal provided to a delay element to generate an output clock signal by delaying an input clock signal; comparing, via a phase detector (PD), the input clock signal and the output clock signal to generate a PD output signal; and accumulating, via a first accumulator, the PD output signal to generate a calibration output signal.

30 Claims, 8 Drawing Sheets

800

850

900

Increment a calibration delay control signal provided to a delay element to generate an output clock signal by delaying an input clock signal 902

Compare, via a phase detector (PD), the input clock signal and the output clock signal to generate a PD output signal 904

Accumulate, via a first accumulator, the PD output signal to generate a calibration output signal 906

DELAY ELEMENT GAIN CALIBRATION

BACKGROUND

Field of the Disclosure

Certain aspects of the present disclosure generally relate to electronic circuits and, more particularly, to techniques and circuitry for calibrating a delay element gain.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for reception via antennas. A receiver may include one or more a phase-locked loop (PLL) which may include a delay element for phase noise cancellation.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a method for delay element calibration (e.g., gain calibration). The method generally includes: incrementing a calibration delay control signal provided to a delay element to generate an output clock signal by delaying an input clock signal; comparing, via a phase detector (PD), the input clock signal and the output clock signal to generate a PD output signal; and accumulating, via a first accumulator, the PD output signal to generate a calibration output signal.

Certain aspects of the present disclosure are directed towards an apparatus for delay element calibration (e.g., gain calibration). The apparatus generally includes: a delay element; a first accumulator configured to increment a calibration delay control signal provided to the delay element, wherein the delay element is configured to generate an output clock signal by delaying an input clock signal based on the calibration delay control signal; a PD configured to generate a PD output signal based on the input clock signal and the output clock signal to; and a second accumulator configured to accumulate the PD output signal to generate a calibration output signal.

Certain aspects of the present disclosure are directed towards an apparatus for delay element calibration. The apparatus generally includes: means for incrementing a calibration delay control signal; means for delaying an input clock signal to generate an output clock signal based on the calibration delay control signal; means for detecting a phase of the output clock signal based on the input clock signal to generate a phase detection output signal; and means for accumulating the phase detection output signal to generate a calibration output signal.

Certain aspects of the present disclosure are directed towards an apparatus for delay element calibration. The apparatus generally includes: a delay element; a PD having a first input coupled to an input of the delay element and having a second input coupled to an output of the delay element; a first accumulator having an input coupled to the input of the delay element; and a second accumulator having a clock input coupled to an output of the PD.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for calibrating a gain for a delay element. Certain aspects provide a delay element gain calibration circuit that includes a phase detector (PD) that generates a PD output signal based on input and output clock signals of the delay element and while a gain control signal of the delay element is being incremented. The PD may sample an output clock signal of the delay element based on an input clock signal of the delay element. An accumulator may be used to accumulate the PD output signal to generate a calibration signal that is used to calibrate gain control for the delay element. For example, based on the calibration signal and a target gain control signal, a gain control signal may be calculated for the delay element for use during a mission mode of a device having the delay element. For example, the delay element may be used at a phase-locked loop (PLL) output to reduce phase noise for a synthesizer. The calibration technique described herein provides calibration to obtain an accurate gain for a delay element. An open-loop calibration technique is described herein, providing a short settling time for the calibration.

Example Wireless Communications

Figure 1:
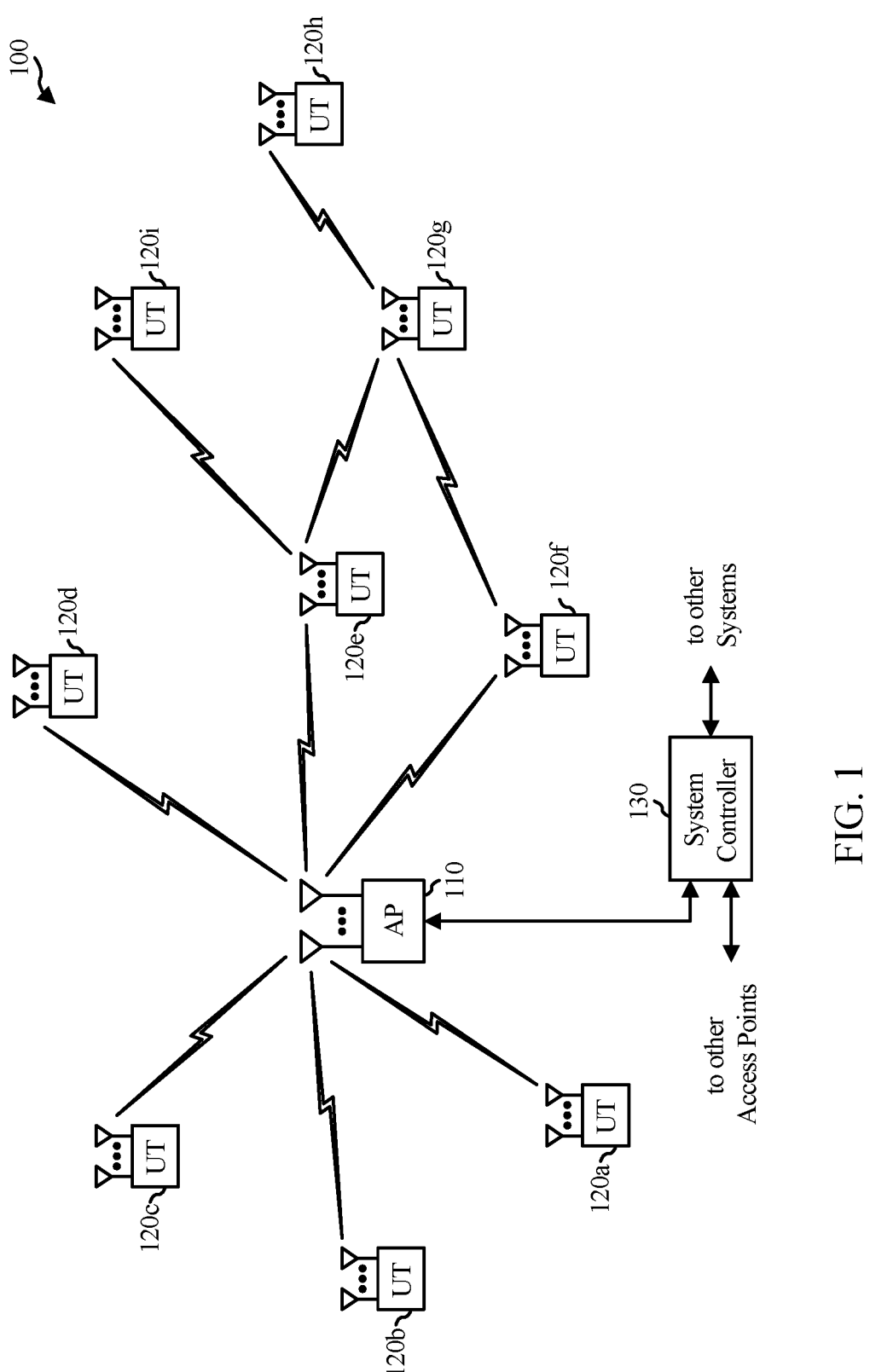
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a synthesizer implemented with delay element gain calibration, as described in more detail herein.

Figure 2:
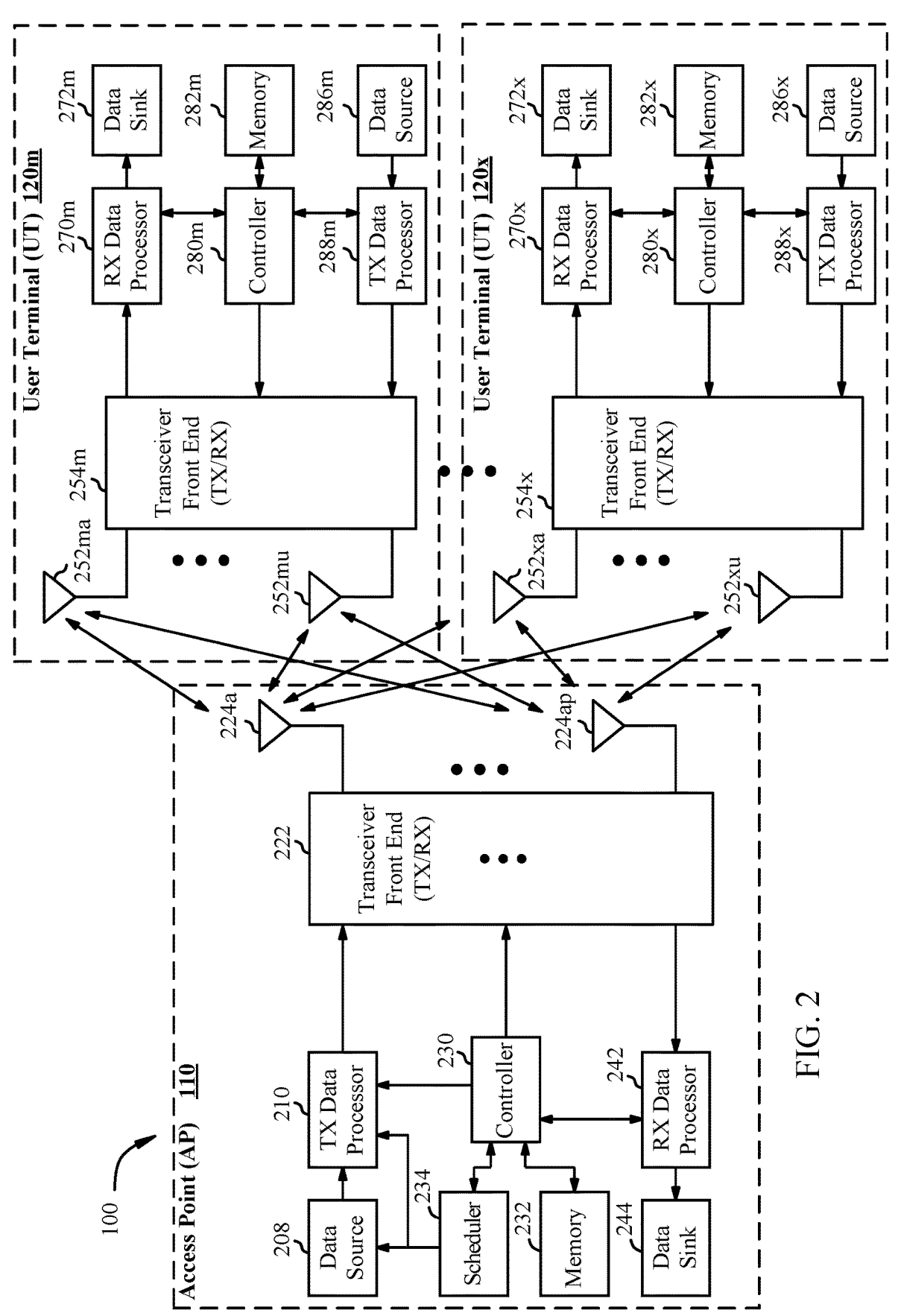
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a transmit (TX) data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. A receive (RX) data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include a synthesizer implemented with delay element gain calibration, as described in more detail herein.

Figure 3:
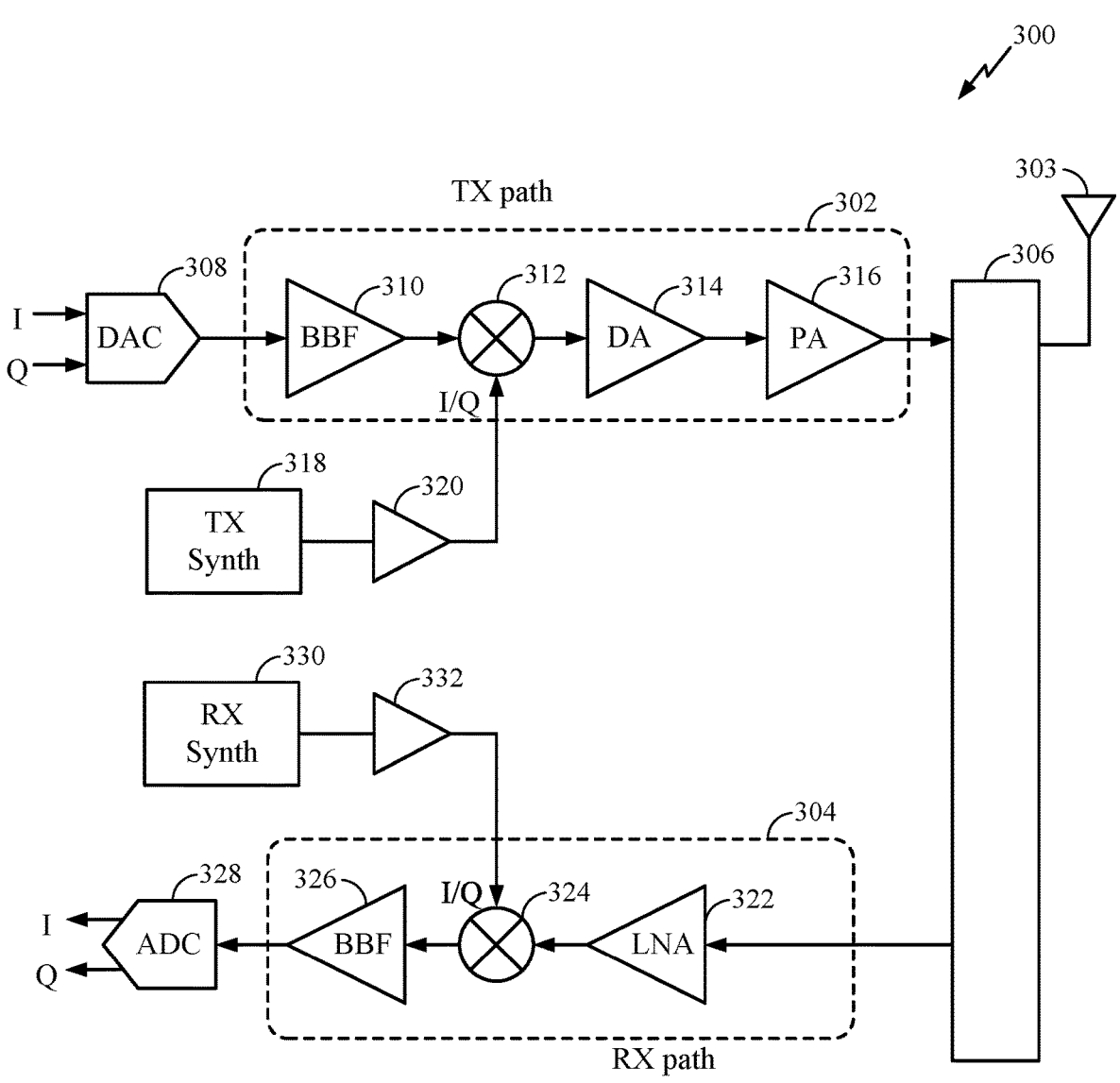
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In some aspects, the synthesizer 318 and/or synthesizer 330 may be implemented with delay element gain calibration, as described in more detail herein.

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Techniques for Delay Element Gain Calibration

Certain aspects of the present disclosure provide a fast and accurate calibration scheme for a gain of a delay element. Certain aspects provide a calibration scheme that uses an open-loop technique, providing a short settling time for calibration. The calibration technique provided herein uses a known oscillation signal period (e.g., voltage-control oscillator (VCO) period) as a reference, providing high accuracy. The delay gain calibration scheme may be applied for any suitable frequency bands.

Figure 4:
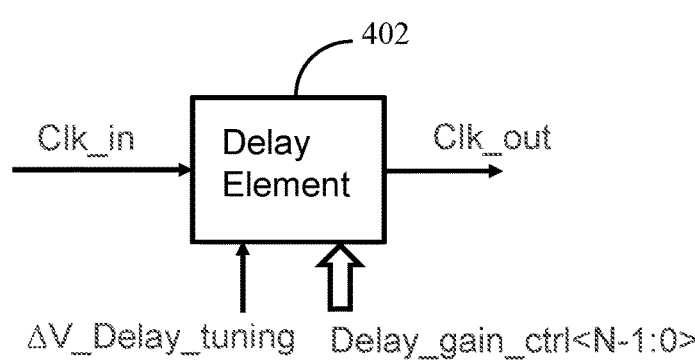
FIG. 4 illustrates a delay element and associated gain calibration circuit, in accordance with certain aspects of the present disclosure.
Figure 4:
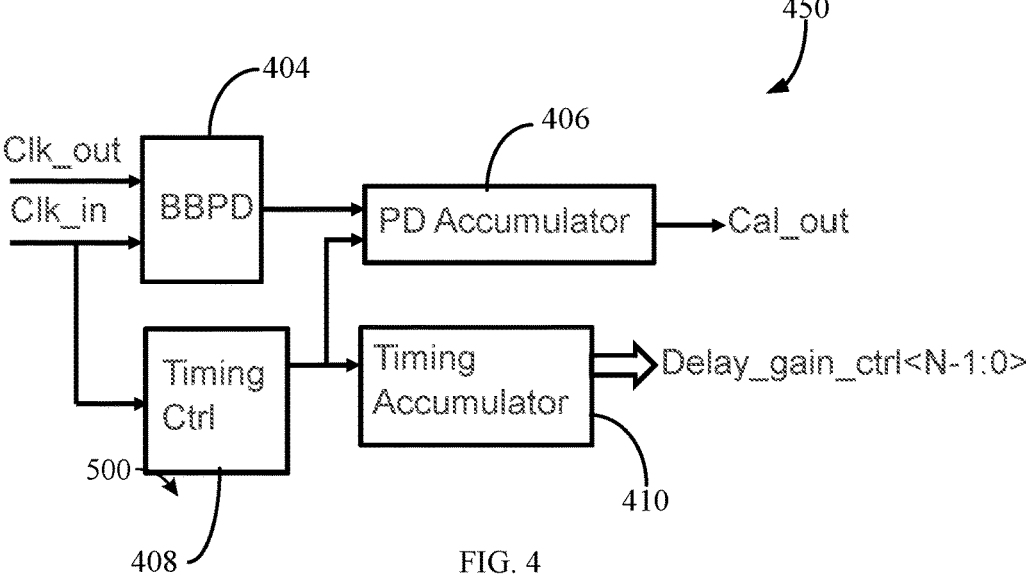

FIG. 4 illustrates a delay element 402 and associated gain calibration circuit 450, in accordance with certain aspects of the present disclosure. As shown, the delay element 402 may receive an input clock (Clk_in) signal and provide an output clock (Clk_out) signal. The delay element may maintain the duty cycle of the Clk_out signal to be the same as the duty cycle of the Clk_in signal. For example, the duty cycles of the Clk_in signal and the Clk_out signal may be at 50% since the same delay may be applied to both rising and falling edges of the Clk_in signal. The Clk_in signal and the Clk_out signal may have the same period, which is known. For example, for a local oscillator circuit in a synthesizer, the Clk_in signal may be a signal generated by a VCO. Thus, the period of the Clk_in signal may be equal to the VCO period ($T_{vco}$).

Figure 5:
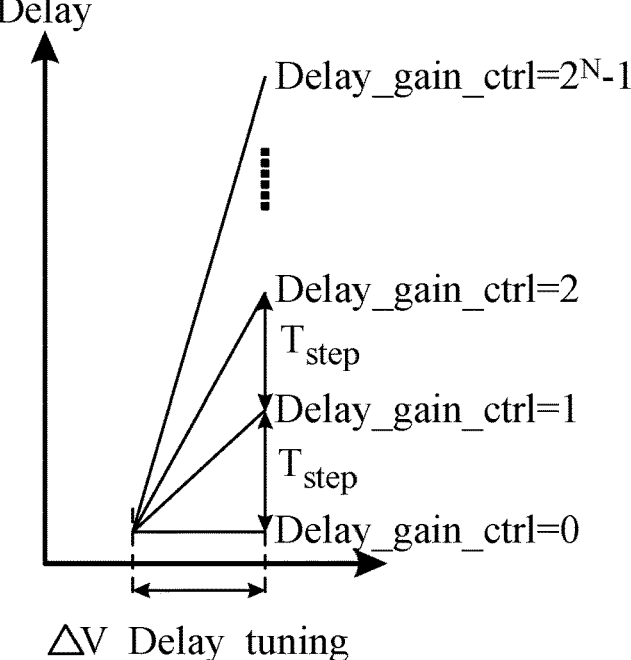
FIG. 5 is a graph showing variation in delay as a function of a delay tuning voltage.

FIG. 5 is a graph 500 showing variation in delay as a function of a delay tuning voltage (ΔV_Delay_tuning). ΔV_Delay_tuning signal is the delay tuning input signal of the delay element 402, which in some applications, may be equal to a phase-locked loop (PLL) tuning voltage ($V_{tune}$) during mission mode. The delay of the delay element varies based on delay tuning voltage (ΔV_Delay_tuning). As shown, the rate of change of the delay is based on delay gain control (delay_gain_ctrl) signal. The delay_gain_ctrl signal may be N bits (delay_gain_ctrl<N−1:0>), N being a positive integer. As shown, the delay element gain tuning resolution is Tstep (e.g., at a maximum delay tuning voltage, each increment of the delay_gain_ctrl signal results in a change in delay of the delay element of Tstep). Referring back to FIG. 4, the gain calibration circuit 450 may include a phase detector 404 (e.g., a bang bang phase detector (BBPD)) which may detect the relative delay between the Clk_in signal and the Clk_out signal, indicating whether the Clk_out signal leads or lags the Clk_in signal.

Figure 6:
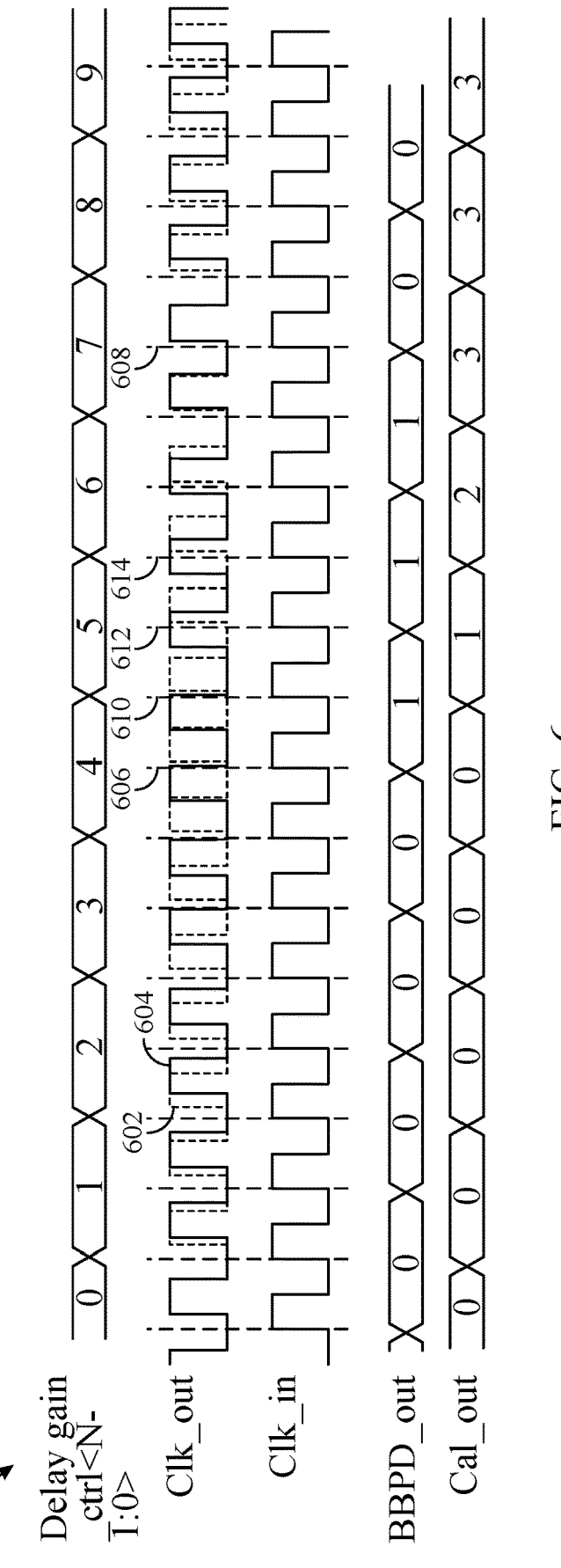
FIG. 6 is a timings diagram illustrating various signals of a calibration circuit, in accordance with certain aspects of the present disclosure.

FIG. 6 is a timings diagram 600 illustrating various signals of the calibration circuit 450, in accordance with certain aspects of the present disclosure. The phase detector 404 (BBPD) may sample the Clk_out signal at the rising edge of the Clk_in signal. Thus, if the Clk_out signal is lagging the Clk_in signal, the BBPD output (BBPD_out) signal may be logic low, and if the Clk_out signal is leading the Clk_in signal, the BBPD output (BBPD_out) signal may be logic high, as shown in timing diagram 600.

Referring back to FIG. 4, the output of the BBPD may be coupled to an input of a PD accumulator 406 used to generate a calibration output (Cal_out) signal. Moreover, the Clk_in signal may be provided to a timing control circuit 408 (labeled "Timing Ctrl"), where an output of the timing control circuit 408 is provided to an input of a timing accumulator 410 and another input of the PD accumulator 406. The timing control circuit 408 generates timing control signals for the accumulators 406, 410. For example, the timing control circuit 408 may include a divide-by-two (DIV2) frequency divider, generating a frequency-divided signal having half the frequency of the Clk_in signal, based on which the timing accumulator 410 generates the incremental codes for delay_gain_ctrl during calibration. For example, as shown in timing diagram 600, the digital value for the delay_gain_ctrl signal is incremented at half the frequency of the Clk_in signal (e.g., every other rising edge of the Clk_in signal). In response to incrementing the delay_gain_ctrl signal, the delay of the Clk_out signal changes. In the timing diagram 600, a first Clk_out signal 602 is shown which represents the Clk_out signal without delay and a second Clk_out signal 604 is shown which represents the Clk_out signal with delay in response to the delay_gain_ctrl signal being incremented. For calibration, a fixed voltage may be used for ΔV_Delay_tuning that is more than the $V_{tune}$ variation range (e.g., is more than a maximum voltage used for $V_{tune}$). As shown, the BBPD_out signal is logic low until time 606 when, at the rising edge of the Clk_in signal, the Clk_out signal is logic high. The BBPD_out signal remains logic high for three clock cycles until time 608 when, at the rising edge of the Clk_in signal, the Clk_out signal is logic low. The PD accumulator 406 operates from the frequency-divided signal generated by the timing control circuit 408. The BBPD_out signal changes (e.g., updates) at every other rising edge (e.g., at times 606, 612) of the Clk_in signal and the PD accumulator 406 generates an accumulated output signal (e.g., calibration out (Cal_out) signal) at a subsequent rising edge (e.g., at time 610, 614) of the Clk_in signal.

Once the BBPD_out signal transitions from logic high back to logic low, the Cal_out signal may be stored and used for calibration during mission mode. In other words, the BBPD_out signal is counted by the PD accumulator 406 to determine how many logic highs the BBPD_out signal has until the BBPD_out signal transitions from logic high back to logic low. The number of logic highs represents half of $T_{vco}$ in unit of delay element gain tuning resolution $T_{step}$. For instance, assume the number of logic highs of the Cal_out signal is m, m being a positive integer. In the example shown in timing diagram 600, m would be equal to three. Thus, $T_{step}$ may be equal to:

$$\frac{T_{vco}}{2m}$$

The delay element gain may be equal to:

$$\frac{\text{Delay\_gain\_ctrl} \times T_{step}}{\Delta V\_Delay\_tuning}$$

For a particular target delay gain (Target_delay_gain), the delay_gain_ctrl code may be calculated as:

$$\text{Delay\_gain\_ctrl} = \text{Target\_delay\_gain} \times \Delta V\_Delay\_tuning \times \frac{2m}{T_{vco}}$$

The target delay gain may be a preconfigured value determined (e.g., using simulation) to reduce phase noise for the synthesizer.

The techniques described herein may be applied for delay gain calibration for various applications. Using calibration, delay element gain may be accurately set for applications such as feed-forward phase noise reduction and digital-to-time converters (DTCs). For instance, VCO noise may be reduced for a phase-locked loop (PLL) if the gain for the delay element is set to a predetermined target value.

Figure 7:
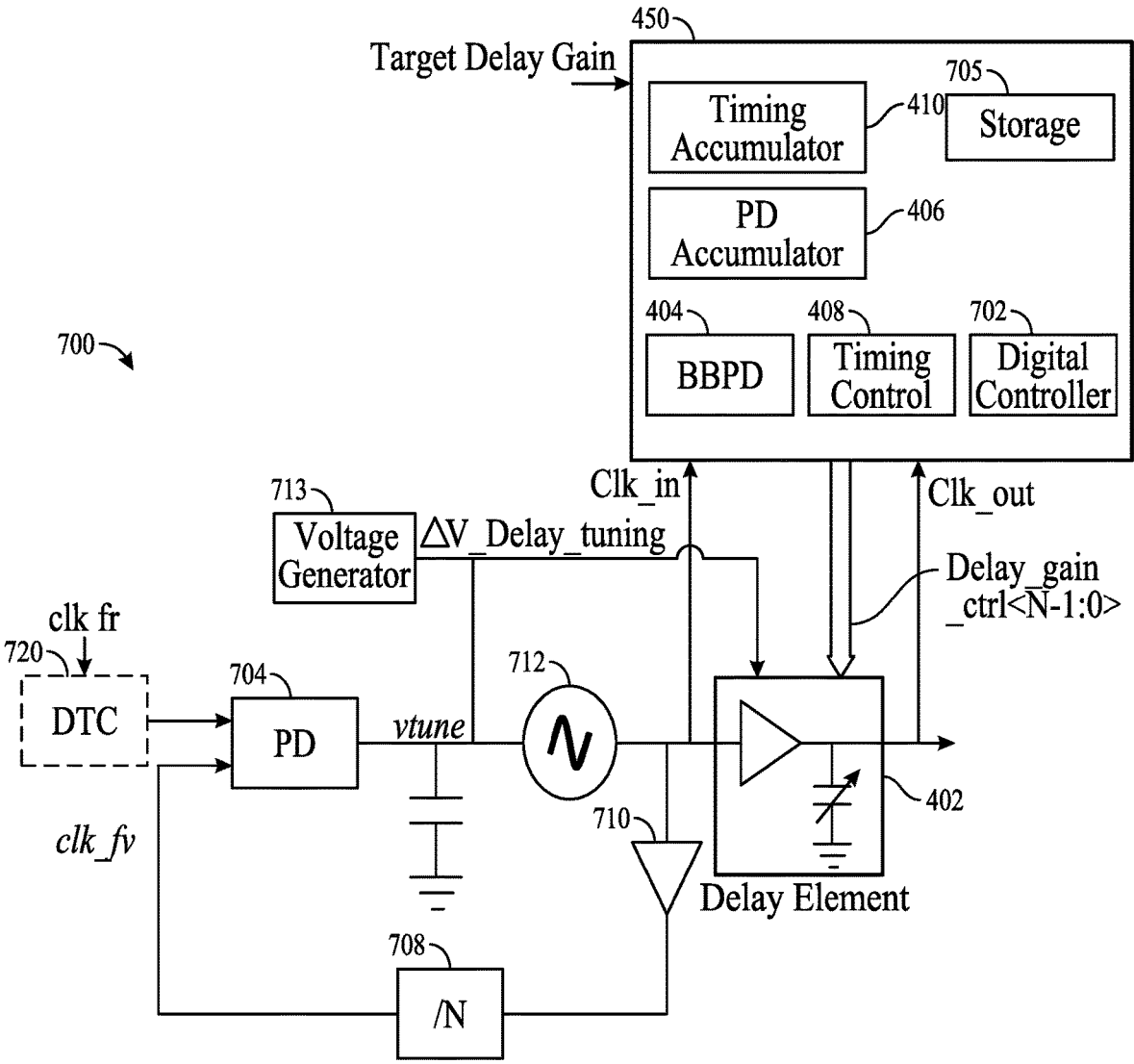
FIG. 7 illustrates a phase-locked loop (PLL) implemented with a calibration circuit for a delay element used to reduce phase noise, in accordance with certain aspects of the present disclosure.

FIG. 7 illustrates a phase-locked loop (PLL) 700 implemented with a calibration circuit for a delay element used to reduce phase noise, in accordance with certain aspects of the present disclosure. The PLL 700 includes a PD 704 receiving an input frequency clock (clk_fr) signal and a feedback voltage clock (clk_fv) signal. The PD may generate a tuning voltage (vtune), which may be used to control a VCO 712 to generate an oscillating signal. The oscillating signal is fed back through a buffer 710 and a divide-by-N frequency divider 708, N being a positive integer. The frequency divider 708 generates the clk_fv signal provided to the PD 704. As shown, the delay element 402 may be coupled to an output of the VCO 712, applying a delay to the oscillating signal based on vtune to reduce phase noise during mission mode.

During calibration, a voltage generator 713 may be used to generate the ΔV_Delay_tuning signal (e.g., a fixed voltage) provided to the delay element 402. As shown, the oscillating signal at the output of the VCO 712 may also be provided as the Clk_in signal to the calibration circuit 450. The calibration circuit 450 may receive the Clk_out signal from the output of the delay element 402.

As shown, the calibration circuit 450 may include a digital controller 702, which may calculate the Delay_gain_ctrl signal based on a received target delay gain and the Cal_out signal stored in a storage device 705 during calibration, as described herein. The calculated Delay_gain_ctrl signal may be provided to the delay element 402 to set the gain of the delay element 402 during mission mode. Moreover, the tuning voltage (vtune) generated by the PD 704 may be provided to the VCO 712 and used as the ΔV_Delay_tuning signal for the delay element.

The calibration circuit 450 may be used to provide an accurate delay gain for a delay element in any suitable application. For example, a delay element may be used in a digital-to-time converter (DTC) and the calibration circuit 450 may be used to calibrate the delay gain for the delay element of the DTC to provide accurate digital-to-time conversion results. In some cases, as shown in FIG. 7, the clk_fr signal may be provided to a DTC 720, where an output of the DTC 720 is coupled to an input of the PD 704.

Figure 8A:
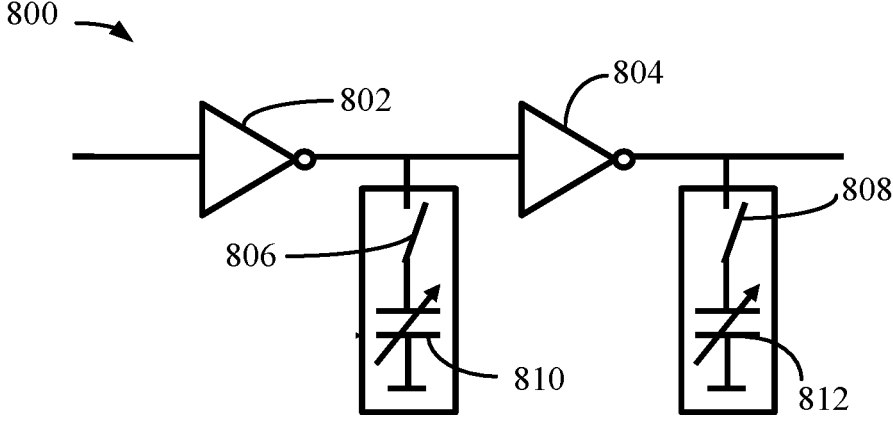
FIGS. 8A and 8B illustrate example implementations of delay elements, having delay tuning and gain control.
Figure 8B:
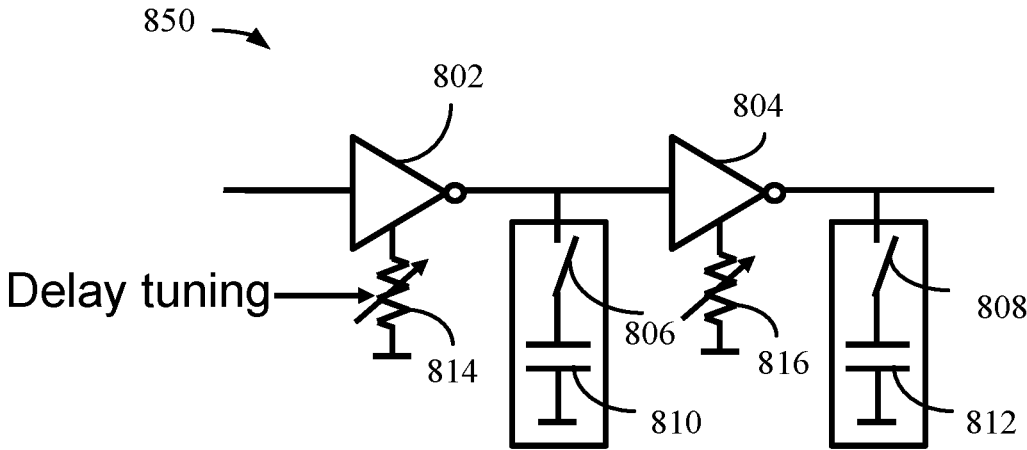

FIGS. 8A and 8B illustrate example implementations of delay elements 800, 850 having delay tuning and gain control. As shown, the delay element 800 may include inverters 802, 804. The output of inverter 802 may be selectively coupled, in shunt, to a capacitive element 810 via a switch 806 and the output of inverter 804 may be selectively coupled, in shunt, to a capacitive element 812 via a switch 808. As shown in FIG. 8A, capacitive elements 810, 812 may be variable capacitive elements, which may be adjusted to tune (e.g., ΔV_Delay_tuning signal) the delay associated with the delay element 800. The switches 806, 808 may be controlled to set the gain of the delay element 800 (e.g., via Delay_gain_ctrl signal). As shown in FIG. 8B, a variable resistive element 814 may be coupled to inverter 802 and a variable resistive element 816 may be coupled to inverter 804. The resistances of the variable resistive elements 814, 816 may be adjusted to adjust a bias of inverters 802, 804 to tune the delay of the delay element 850 via the ΔV_Delay_tuning signal. The switches 806, 808 may be controlled to set the gain of the delay element 850 (e.g., via Delay_gain_ctrl signal).

Figure 9:
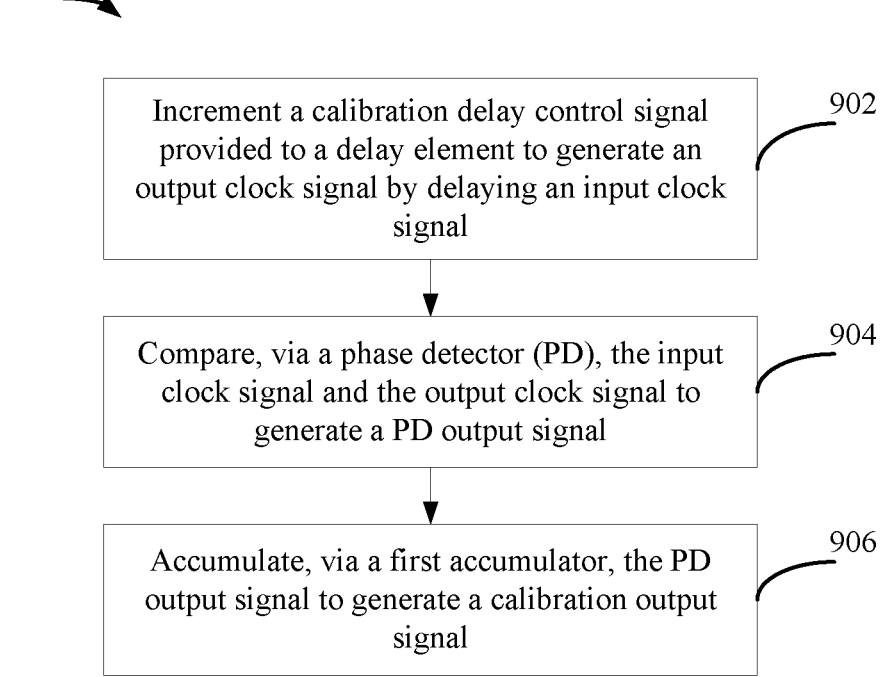
FIG. 9 is a flow diagram depicting example operations for delay element calibration, in accordance with certain aspects of the present disclosure.

FIG. 9 is a flow diagram depicting example operations 900 for delay element calibration, in accordance with certain aspects of the present disclosure. For example, the operations 900 may be performed by a delay element (e.g., delay element 402), a calibration circuit (e.g., calibration circuit 450), and/or voltage generator (e.g., voltage generator 713).

At block 902, the calibration circuit increments a calibration delay control signal (e.g., a gain control signal) provided to a delay element to generate an output clock signal by delaying an input clock signal. The input clock signal may be an oscillating signal generated via a VCO (e.g., VCO 712). The VCO may be part of a PLL (e.g., PLL 700).

At block 904, the calibration circuit compares, via a phase detector (PD) (e.g., phase detector 404), the input clock signal (e.g., Clk_in signal) and the output clock signal (e.g., Clk_out signal) to generate a PD output signal. In some aspects, comparing the input clock signal and the output clock signal may include sampling the output clock signal based on the input clock signal. The output clock signal may be sampled at a rising edge of the input clock signal. At block 906, the calibration circuit accumulates, via a first accumulator (e.g., accumulator 406), the PD output signal to generate a calibration output signal.

In some aspects, the voltage generator may generate a delay tuning voltage and provide the delay tuning voltage to the delay element. The output clock signal may be generated based on the delay tuning voltage. In some aspects, the calibration circuit may calculate (e.g., via controller 702) a mission mode delay control signal (e.g., Delay_gain_ctrl signal calculated for mission mode) based on the calibration output signal, a target delay control signal (e.g., a target delay gain control signal), and the delay tuning voltage, and provide the mission mode delay control signal to the delay element to generated a delayed signal during mission mode of operation.

In some aspects, the calibration circuit may frequency divide, via a timing control circuit (e.g., timing control circuit 408), the input clock signal to yield a frequency-divided signal. The PD output signal may be accumulated based on the frequency-divided signal. The calibration delay control signal may be incremented via a second accumulator (e.g., accumulator 410) based on the frequency-divided signal.

Example Aspects

Aspect 1: A method for delay element calibration, comprising: incrementing a calibration delay control signal provided to a delay element to generate an output clock signal by delaying an input clock signal; comparing, via a phase detector (PD), phases of the input clock signal and the output clock signal to generate a PD output signal; and accumulating, via a first accumulator, the PD output signal to generate a calibration output signal.

Aspect 2: The method of Aspect 1, further comprising controlling a delay of the delay element based on the calibration output signal.

Aspect 3: The method of Aspect 1 or 2, further comprising: generating, via a voltage generator, a delay tuning voltage; and providing the delay tuning voltage to the delay element, wherein the output clock signal is generated based on the delay tuning voltage.

Aspect 4: The method of Aspect 3, further comprising: calculating a mission mode delay control signal based on the calibration output signal, a target delay control signal, and the delay tuning voltage; and providing the mission mode delay control signal to the delay element to generate a delayed signal during a mission mode of operation, the delayed signal having a time delay controlled by the mission mode delay control signal.

Aspect 5: The method according to any of Aspects 1-4, further comprising frequency dividing, via a timing control circuit, the input clock signal to yield a frequency-divided signal, wherein the PD output signal is accumulated via the first accumulator based on the frequency-divided signal.

Aspect 6: The method of Aspect 5, further comprising incrementing, via a second accumulator, the calibration delay control signal based on the frequency-divided signal.

Aspect 7: The method according to any of Aspects 1-6, wherein comparing the input clock signal and the output clock signal comprises sampling the output clock signal based on the input clock signal.

Aspect 8: The method of Aspect 7, wherein the output clock signal is sampled at a rising edge of the input clock signal.

Aspect 9: The method according to any of Aspects 1-8, wherein the input clock signal comprises an oscillating signal generated via a voltage-controlled oscillator (VCO).

Aspect 10: The method of Aspect 9, wherein the VCO is part of a phase-locked loop (PLL).

Aspect 11: An apparatus for delay element calibration, comprising: a delay element; a first accumulator configured to increment a calibration delay control signal provided to the delay element, wherein the delay element is configured to generate an output clock signal by delaying an input clock signal based on the calibration delay control signal; a phase detector (PD) having a first input coupled to an input of the delay element and having a second input coupled to an output of the delay element, the PD being configured to generate a PD output signal based on a phase difference between the input clock signal and the output clock signal; and a second accumulator having an input coupled to an output of the PD and configured to accumulate the PD output signal to generate a calibration output signal.

Aspect 12: The apparatus of Aspect 11, further comprising a voltage generator having an output coupled to a control input of the delay element, the voltage generator being configured to generate a delay tuning voltage and provide the delay tuning voltage to the delay element, wherein the delay element is configured to generate the output clock signal based on the delay tuning voltage.

Aspect 13: The apparatus of Aspect 12, further comprising a controller having an input coupled to an output of the second accumulator and an output coupled to the control input of the delay element, the controller being configured to: calculate a mission mode delay control signal based on the calibration output signal, a target delay control signal, and the delay tuning voltage; and provide the mission mode delay control signal to the delay element to generate a delayed signal during mission mode of operation.

Aspect 14: The apparatus according to any of Aspects 11-13, further comprising a timing control circuit having an input coupled to the input of the delay element, the timing control circuit being configured to frequency divide the input clock signal to yield a frequency-divided signal, wherein the second accumulator has a clock input coupled to an output of the timing control circuit and is configured to accumulate the PD output signal based on the frequency-divided signal.

Aspect 15: The apparatus of Aspect 14, wherein the first accumulator has an input coupled to the output of the timing control circuit and is configured to increment the calibration delay control signal based on the frequency-divided signal.

Aspect 16: The apparatus according to any of Aspects 11-15, wherein, to generate the PD output signal, the PD is configured to sample the output clock signal based on the input clock signal.

Aspect 17: The apparatus of Aspect 16, wherein the PD is configured to sample the output clock signal at a rising edge of the input clock signal.

Aspect 18: The apparatus according to any of Aspects 11-17, wherein a voltage-controlled oscillator (VCO) is configured to generate the input clock signal.

Aspect 19: The apparatus of Aspect 18, further comprising a phase-locked loop (PLL) including the VCO.

Aspect 20: The apparatus according to any of Aspects 11-19, further comprising a digital-to-time converter (DTC) including the delay element.

Aspect 21: An apparatus for delay element calibration, comprising: means for incrementing a calibration delay control signal; means for delaying an input clock signal to generate an output clock signal based on the calibration delay control signal; means for detecting a phase of the output clock signal based on the input clock signal to generate a phase detection output signal; and means for accumulating the phase detection output signal to generate a calibration output signal.

Aspect 22: The apparatus of Aspect 21, further comprising means for controlling a delay of the delay element based on the calibration output signal.

Aspect 23: An apparatus for delay element calibration, comprising: a delay element; a phase detector (PD) having a first input coupled to an input of the delay element and having a second input coupled to an output of the delay element; a first accumulator having an input coupled to the input of the delay element; and a second accumulator having a clock input coupled to an output of the PD.

Aspect 24: The apparatus of Aspect 23, further comprising a voltage generator having an output coupled to a control input of the delay element.

Aspect 25: The apparatus of Aspect 24, further comprising a controller having an input coupled to an output of the second accumulator and an output coupled to the control input of the delay element.

Aspect 26: The apparatus according to any of Aspects 23-25, further comprising a timing control circuit having an input coupled to the input of the delay element, wherein the clock input of the second accumulator is coupled to an output of the timing control circuit.

Aspect 27: The apparatus of Aspect 26, wherein the first accumulator has another input coupled to the output of the timing control circuit.

Aspect 28: The apparatus according to any of Aspects 23-27, wherein the input of the delay element is coupled to an output of a voltage-controlled oscillator (VCO).

Aspect 29: The apparatus of Aspect 28, further comprising a phase-locked loop (PLL) including the VCO.

Aspect 30: The apparatus according to any of Aspects 23-29, further comprising a digital-to-time converter (DTC) including the delay element.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for incrementing may include an accumulator, such as the accumulator 410, means for delaying may include a delay element such as the delay element 402, means for detecting may include a phase detector such as the phase detector 404, and the means for accumulating may include an accumulator such as the accumulator 406. Means for controlling may include a controller, such as the controller 702.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for delay element calibration, comprising:
   incrementing a calibration delay control signal provided to a delay element to generate an output clock signal by delaying an input clock signal, wherein the calibration delay control signal comprises a delay gain control signal configured to incrementally adjust a gain of the delay element, the gain of the delay element comprising an amount of change in delay associated with the delay element in response to a change in a delay tuning voltage;

comparing, via a phase detector (PD), phases of the input clock signal and the output clock signal to generate a PD output signal; and accumulating, via a first accumulator, the PD output signal to generate a calibration output signal.

2. The method of claim 1, further comprising controlling, via the delay tuning voltage, the delay of the delay element based on the calibration output signal, wherein the delay is controlled separately from the gain.

3. The method of claim 1, further comprising:
   generating, via a voltage generator, the delay tuning voltage; and
   providing the delay tuning voltage to the delay element, wherein the output clock signal is generated based on the delay tuning voltage.

4. The method of claim 3, further comprising:
   calculating a mission mode delay control signal based on the calibration output signal, a target delay control signal, and the delay tuning voltage; and
   providing the mission mode delay control signal to the delay element to generate a delayed signal during a mission mode of operation, the delayed signal having a time delay controlled by the mission mode delay control signal.

5. The method of claim 1, further comprising frequency dividing, via a timing control circuit, the input clock signal to yield a frequency-divided signal, wherein the PD output signal is accumulated via the first accumulator based on the frequency-divided signal.

6. The method of claim 5, wherein the calibration delay control signal is incremented, via a second accumulator, based on the frequency-divided signal.

7. The method of claim 1, wherein comparing the input clock signal and the output clock signal comprises sampling the output clock signal based on the input clock signal.

8. The method of claim 7, wherein the output clock signal is sampled at a rising edge of the input clock signal.

9. The method of claim 1, wherein the input clock signal comprises an oscillating signal generated via a voltage-controlled oscillator (VCO).

10. The method of claim 9, wherein the VCO is part of a phase-locked loop (PLL).

11. An apparatus for delay element calibration, comprising:
   a delay element;
   a first accumulator configured to increment a calibration delay control signal provided to the delay element, wherein the delay element is configured to generate an output clock signal by delaying an input clock signal based on the calibration delay control signal, wherein the calibration delay control signal comprises a delay gain control signal configured to incrementally adjust a gain of the delay element, the gain of the delay element comprising an amount of change in delay associated with the delay element in response to a change in a delay tuning voltage;
   a phase detector (PD) having a first input coupled to an input of the delay element and having a second input coupled to an output of the delay element, the PD being configured to generate a PD output signal based on a phase difference between the input clock signal and the output clock signal; and
   a second accumulator having an input coupled to an output of the PD and configured to accumulate the PD output signal to generate a calibration output signal.

12. The apparatus of claim 11, further comprising a voltage generator having an output coupled to a control input of the delay element, the voltage generator being configured to generate the delay tuning voltage and provide the delay tuning voltage to the delay element to control the delay associated with the delay element separately from the gain, wherein the delay element is configured to generate the output clock signal based on the delay tuning voltage.

13. The apparatus of claim 12, further comprising a controller having an input coupled to an output of the second accumulator and an output coupled to the control input of the delay element, the controller being configured to:

calculate a mission mode delay control signal based on the calibration output signal, a target delay control signal, and the delay tuning voltage; and provide the mission mode delay control signal to the delay element to generate a delayed signal during mission mode of operation.

14. The apparatus of claim 11, further comprising a timing control circuit having an input coupled to the input of the delay element, the timing control circuit being configured to frequency divide the input clock signal to yield a frequency-divided signal, wherein the second accumulator has a clock input coupled to an output of the timing control circuit and is configured to accumulate the PD output signal based on the frequency-divided signal.

15. The apparatus of claim 14, wherein the first accumulator has an input coupled to the output of the timing control circuit and is configured to increment the calibration delay control signal based on the frequency-divided signal.

16. The apparatus of claim 11, wherein, to generate the PD output signal, the PD is configured to sample the output clock signal based on the input clock signal.

17. The apparatus of claim 16, wherein the PD is configured to sample the output clock signal at a rising edge of the input clock signal.

18. The apparatus of claim 11, wherein a voltage-controlled oscillator (VCO) is configured to generate the input clock signal.

19. The apparatus of claim 18, further comprising a phase-locked loop (PLL) including the VCO.

20. The apparatus of claim 11, further comprising a digital-to-time converter (DTC) including the delay element.

21. An apparatus for delay element calibration, comprising:

means for incrementing a calibration delay control signal;

means for delaying an input clock signal to generate an output clock signal based on the calibration delay control signal, wherein the calibration delay control signal comprises a delay gain control signal configured to incrementally adjust a gain of the means for delaying, the gain of the means for delaying comprising an amount of change in delay associated with the means for delaying in response to a change in a delay tuning voltage;

means for detecting a phase of the output clock signal based on the input clock signal to generate a phase detection output signal; and means for accumulating the phase detection output signal to generate a calibration output signal.

22. The apparatus of claim 21, further comprising means for controlling, via the delay tuning voltage, the delay of the delay element based on the calibration output signal, wherein the delay is controlled separately from the gain.

23. An apparatus for delay element calibration, comprising:

a delay element;

a phase detector (PD) having a first input coupled to an input of the delay element and having a second input coupled to an output of the delay element;

a first accumulator having an input coupled to the input of the delay element, wherein the first accumulator comprises a delay gain control output coupled to the delay element, the delay gain control output being configured to control a gain of the delay element comprising an amount of change in delay associated with the delay element in response to a change in a delay tuning voltage; and a second accumulator having a clock input coupled to an output of the PD.

24. The apparatus of claim 23, further comprising a voltage generator having an output coupled to a control input of the delay element.

25. The apparatus of claim 24, further comprising a controller having an input coupled to an output of the second accumulator and an output coupled to the control input of the delay element.

26. The apparatus of claim 23, further comprising a timing control circuit having an input coupled to the input of the delay element, wherein the clock input of the second accumulator is coupled to an output of the timing control circuit.

27. The apparatus of claim 26, wherein the first accumulator has another input coupled to the output of the timing control circuit.

28. The apparatus of claim 23, wherein the input of the delay element is coupled to an output of a voltage-controlled oscillator (VCO).

29. The apparatus of claim 28, further comprising a phase-locked loop (PLL) including the VCO.

30. The apparatus of claim 23, further comprising a digital-to-time converter (DTC) including the delay element.

* * * * *